(12) United States Patent
Wang et al.

(10) Patent No.: US 6,680,474 B2
(45) Date of Patent: Jan. 20, 2004

(54) SEMICONDUCTOR CALIBRATION WAFER WITH NO CHARGE EFFECT

(75) Inventors: Chi-Yao Wang, Jubei (TW); Ming-Shuo Yen, Hsin-chu (TW)

(73) Assignee: Taiwan Semiconductor Manufacturing Co., Ltd, Hsin Chu (JP)

( * ) Notice: Subject to any disclaimer, the term of this patent is extended or adjusted under 35 U.S.C. 154(b) by 27 days.

(21) Appl. No.: 10/046,806

(22) Filed: Jan. 14, 2002

(65) Prior Publication Data

US 2003/0132374 A1 Jul. 17, 2003

(51) Int. Cl.7 .............................................. G01D 18/00
(52) U.S. Cl. ..................... 250/252.1; 250/307; 250/310; 250/311; 250/492.2; 438/14; 438/18; 438/592; 438/593
(58) Field of Search .............................. 250/252.1, 307, 250/310, 311, 492.2; 438/14, 18, 592, 593

(56) References Cited

U.S. PATENT DOCUMENTS 5,920,067 A * 7/1999 Cresswell et al. .......... 250/306
6,048,743 A * 4/2000 Yang et al. ................... 438/14
6,420,702 B1 * 7/2002 Tripsas et al. .............. 250/310
6,420,703 B1 * 7/2002 Wu et al. .................... 250/311

* cited by examiner

Primary Examiner—Bruce Anderson
Assistant Examiner—James J Leybourne
(74) Attorney, Agent, or Firm—Tung & Associates

(57) ABSTRACT

A semiconductor calibration wafer that has no charge effect is disclosed. The calibration wafer has a substrate layer and a conductive metal layer. The conductive metal layer completely covers the substrate layer, and has a critical dimension (CD) bar corresponding to a desired CD. The substrate layer may be an oxide layer or another type of substrate layer, whereas the conductive metal layer may be an aluminum layer, a copper layer, or another type of conductive metal layer. Where the calibration wafer is used in conjunction with a scanning electron microscope (SEM) to monitor the CD, the electrons ejected by the SEM do not remain on the semiconductor calibration wafer, but instead are carried away via the conductive metal layer. The calibration wafer is thus not vulnerable to the charge effect.

20 Claims, 5 Drawing Sheets

US 6,680,474 B2

SEMICONDUCTOR CALIBRATION WAFER WITH NO CHARGE EFFECT

FIELD OF THE INVENTION

This invention relates generally to semiconductor calibration wafers for inspecting critical dimensions (CD's), and more particularly to the use of such wafers with scanning electron microscopes (SEM's).

BACKGROUND OF THE INVENTION

Since the invention of the integrated circuit (IC), semiconductor chip features have become exponentially smaller and the number of transistors per device exponentially larger. Advanced IC's with hundreds of millions of transistors at feature sizes of 0.25 micron, 0.18 micron, and less are becoming routine. Improvement in overlay tolerances in photolithography, and the introduction of new light sources with progressively shorter wavelengths, have allowed optical steppers to significantly reduce the resolution limit for semiconductor fabrication far beyond one micron. To continue to make chip features smaller, and increase the transistor density of semiconductor devices, IC's have begun to be manufactured that have features smaller than the lithographic wavelength.

Sub-wavelength lithography, however, places large burdens on lithographic processes. Resolution of anything smaller than a wavelength is generally quite difficult. Pattern fidelity can deteriorate dramatically in sub-wavelength lithography. The resulting semiconductor features may deviate significantly in size and shape from the ideal pattern drawn by the circuit designer. Critical dimensions (CD's), which are the geometries and spacings used to monitor the pattern size and ensure that it is within the customer's specification, are especially important to have size maintenance during processing. CD non-uniformity refers to when the designed and actual values do not match, or when the CD's of multiple features on the same semiconductor device that should be identical are not. Ideally, CD non-uniformity is minimized, but in actuality such non-uniformity can measurably affect the resulting semiconductor device's performance and operation.

CD scanning electron microscopes can be used (CD-SEM's) for CD measurement and verification. Such CD measurement is referred to as CD-SEM measurement. An SEM varies from an optical microscope in many respects. The illumination source is an electron beam scanned over the wafer or device surface. The impinging electrons cause electrons on the surface to be ejected. These secondary electrons are collected and translated into a picture of the surface, on either a screen or a photograph. An SEM needs the wafer and the beam to be in a vacuum. The electron beam has a smaller wavelength than white light, and allows the resolution of surface detail down to sub-micrometer levels. Depth of field problems are non-existent, because every plane on the surface is in focus. Magnification is very high. A tilting wafer holder in an SEM allows the viewing of the surface at angles, which enhances three-dimensional perspectives.

For a CD-SEM, the SEM typically measures a calibration wafer, which is commonly referred to as a CD-SEM calibration wafer, or an SEM-CD calibration wafer. FIG. 1 shows an example of such a wafer 100. The calibration wafer 100 has an oxide layer 102, on which a polysilicon layer 104 has been deposited and etched, so that it has the desired CD, as the width 106. Therefore, measuring the width 106 and comparing it to the desired width allows for the CD to be monitored.

Unfortunately, the oxide layer 102 and the polysilicon layer 104 do not have good conductivity. Over time, measurements of the wafer 100 by an SEM will result in electrons ejected by the SEM to remain on the surface of the wafer, which is known and referred to as the charge effect, or the charging effect. FIG. 2 shows the wafer 100 as the wafer 100', in which electrons 202 remain on the surface of the wafer. Because of the excess electrons 202, after the wafer 100 has been measured a number of times by an SEM, the width of the CD width 106 will be erroneously measured as the width 106'. That is, each time the wafer 100 is measured, more electrons 202 remain on the surface of the wafer, causing the width 106 to increase as the width 106'. From the first time to the twentieth time the width 106 is measured, the measurement may increase from 0.174 micron to 0.181 micron, for example.

To overcome this problem, the currently accepted approach is to measure CD pitch instead of CD width, where a number of CD's are spaced evenly across the wafer surface. By measuring the pitch between CD widths, and then correlating the pitch measured with CD width, the charge effect problem can be overcome in some situations. For instance, FIG. 3 shows a wafer 300 in which polysilicon lines 304a, 304b, and 304c are deposited and etched on an oxide layer 302. Rather than measuring the width of one or more of these lines, the CD-SEM instead measures the pitch between the lines, such as the pitch 306a and/or the pitch 306b. The electrons 308 remaining on the surface of the oxide layer 302 do not affect pitch measurement.

However, measuring CD pitch instead of CD width directly has disadvantages. The correlation of CD to pitch may be difficult to accomplish, resulting in less than desirable accuracy of the resulting CD inference. Furthermore, some semiconductor devices have CD's that cannot be represented easily as a series of spaced CD's on a calibration wafer. For such devices, the indirect measurement of CD width via CD pitch is not possible.

Therefore, there is a need for measuring CD's that overcomes these disadvantages. More specifically, there is a need for measuring CD's with an SEM that overcomes these disadvantages. Such measurement should not be vulnerable to the charge effect that has been described. However, such CD measurement should also not be performed indirectly via CD pitch measurement. For these and other reasons, there is a need for the present invention.

SUMMARY OF THE INVENTION

The invention relates to a semiconductor calibration wafer that has no charge effect. The calibration wafer has a substrate layer and a conductive metal layer. The conductive metal layer completely covers the substrate layer, and has a critical dimension (CD) bar corresponding to a desired CD. The substrate layer may be an oxide layer or another type of substrate layer, whereas the conductive metal layer may be an aluminum layer, a copper layer, or another type of conductive metal layer. Where the calibration wafer is used in conjunction with a scanning electron microscope (SEM) to monitor the CD, the electrons ejected by the SEM do not remain on the semiconductor calibration wafer, but instead are carried away via the conductive metal layer. Thus, the calibration wafer is not vulnerable to the charge effect.

Embodiments of the invention provide for advantages over the prior art. Because the semiconductor calibration wafer is not vulnerable to the charge effect, the CD can be measured directly as the CD bar within the conductive metal layer, which is also referred to as the CD line or CD area within the conductive metal layer in an interchangeable manner. That is, the CD does not have to be measured indirectly via CD pitch. Furthermore, as the SEM is used a number of times to measure the CD, no electrons remain on the surface of the wafer that can skew measurements. Instead, the electrons are carried away via the conductive metal layer that completely covers the substrate layer. Still other advantages, aspects, and embodiments of the invention will become apparent by reading the detailed description that follows, and by referring to the accompanying drawings.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Figure 1:
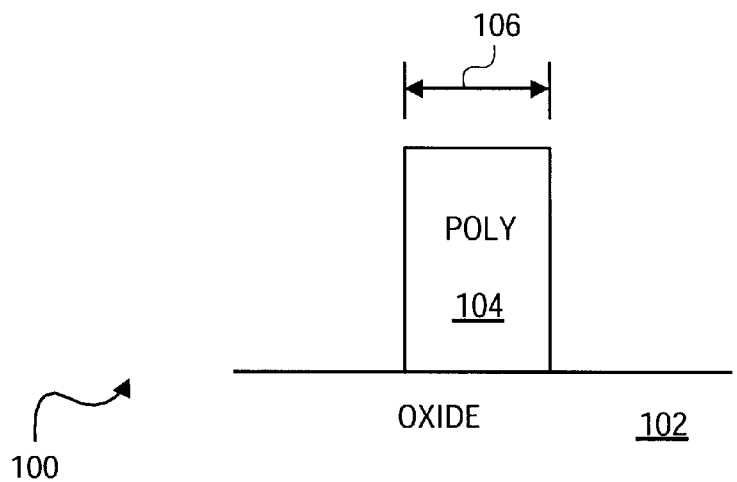
FIG. 1 is a diagram of a semiconductor calibration wafer according to the prior art that is vulnerable to the charge effect when used in conjunction with a scanning electron microscope (SEM) to measure and monitor a critical dimension (CD).
Figure 2:
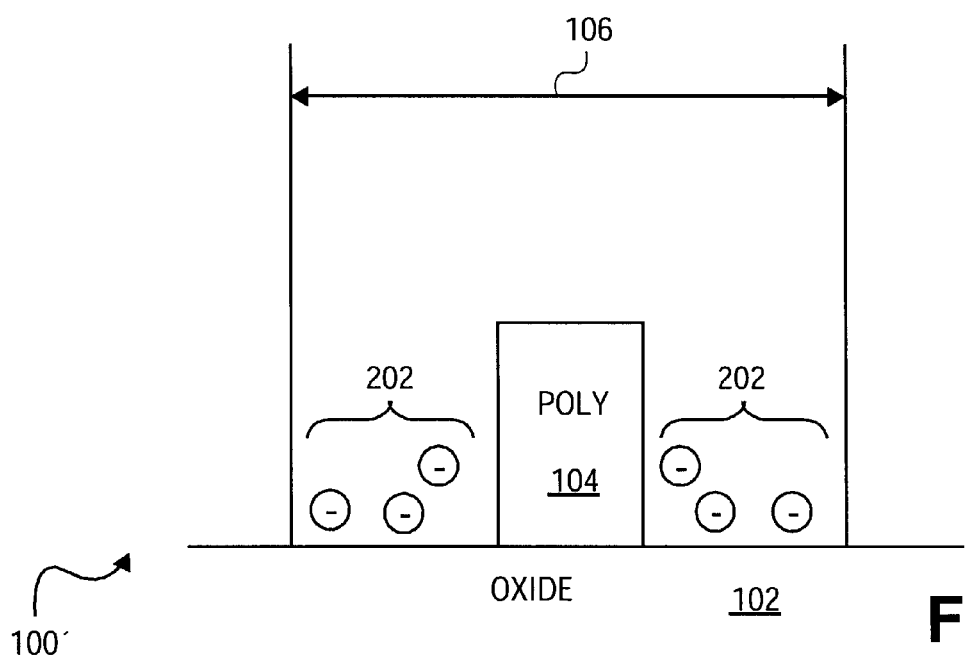
FIG. 2 is a diagram showing how the wafer of FIG. 1 according to the prior art is vulnerable to the charge effect, such that measurement of the CD is skewed, affecting monitoring of the CD when using an SEM.
Figure 3:
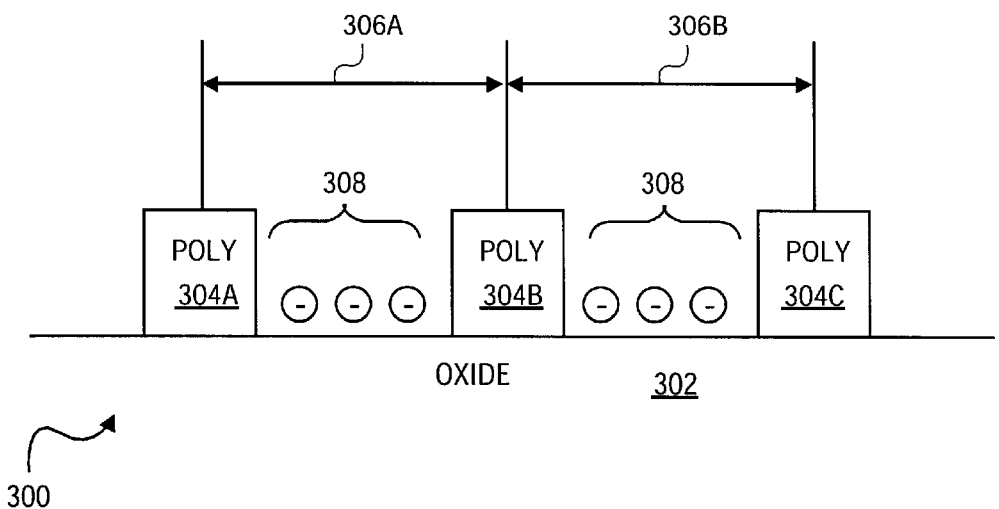
FIG. 3 is a diagram showing how the prior art overcomes the charge effect skewing CD measurement in a limited manner, by directly measuring CD pitch, and correlating CD pitch to the CD.
Figure 4:
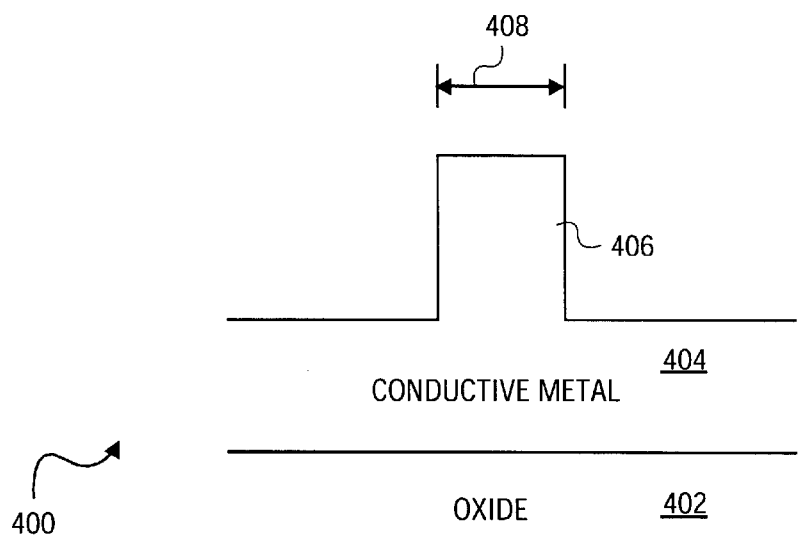
FIG. 4 is a diagram of a semiconductor calibration wafer according to an embodiment of the invention in which a conductive metal layer completely covers a substrate layer. The wafer of FIG. 4 can be used in conjunction with CD measurement and/or in conjunction with use of an SEM, without the charge effect skewing measurement. The wafer of FIG. 4 furthermore allows for direct CD measurement, and not indirect CD measurement by direct CD pitch measurement, as in the prior art.

FIG. 4 shows a semiconductor calibration wafer 400 according to an embodiment of the invention that is not susceptible to the charge effect when used in conjunction with a scanning electron microscope (SEM). The wafer 400 has a conductive metal layer 404 that completely covers an oxide layer 402. The conductive metal layer 404 has a critical dimension (CD) bar 406, which is also referred to as a CD line, CD bar area, or CD area interchangeably herein. The CD bar 406 has a width 408 that is the desired CD and that can be measured by semiconductor monitoring equipment such as an SEM, repeatedly, without measurement skew resulting from the charge effect. The conductive metal layer 404 may be an aluminum layer, a copper layer, or another type of conductive metal layer. The oxide layer 402 is more generally a substrate layer.

Figure 5:
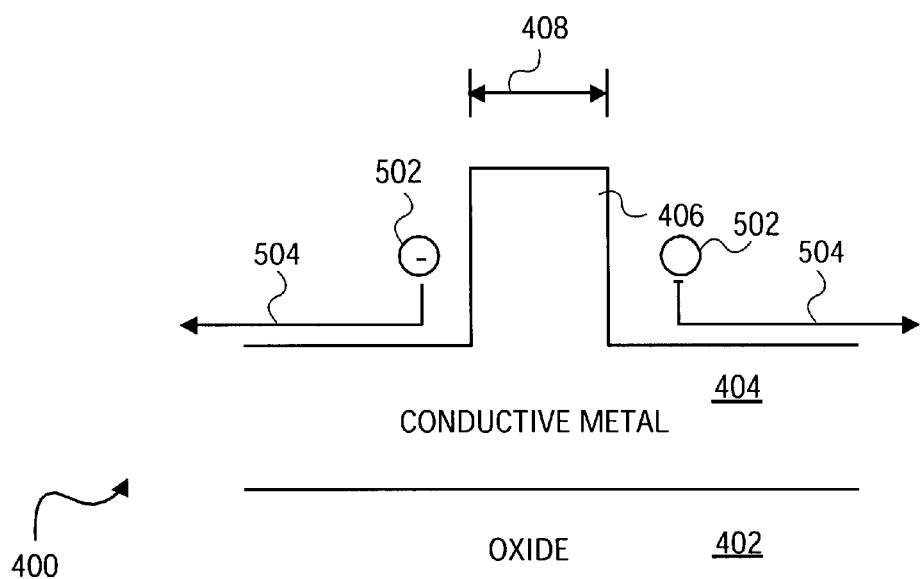
FIG. 5 is a diagram showing how the wafer of FIG. 4 according to an embodiment of the invention is not vulnerable to the charge effect, such that measurement of the CD is not skewed when monitored by using an SEM.

FIG. 5 shows how the wafer 400 of FIG. 4 is not vulnerable to the charge effect according to one embodiment of the invention. Electrons 502 are carried away via the conductive metal layer 402. That is, the electrons 502 do not remain on the surface of the semiconductor calibration wafer 400, and as such they do not affect or otherwise skew the CD measurement taken as the width 408 by an SEM or another type of semiconductor monitoring equipment. For instance, the conductive metal layer 402 may be grounded (not shown in FIG. 5), so that such electrons 502 inherently go to ground. The semiconductor calibration wafer 400 may more particularly be a CD semiconductor calibration wafer, or an SEM-CD semiconductor calibration wafer.

Figure 6:
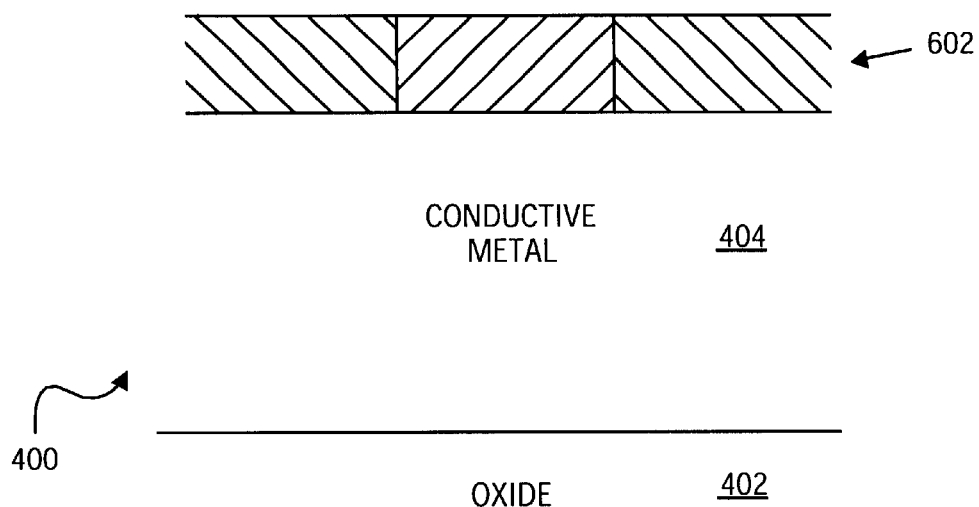
FIGS. 6, 7 and 8 are diagrams showing the wafer of FIG. 4 can be fabricated according to an embodiment of the invention, where the result of the fabrication shown in FIGS. 6, 7 and 8 is the semiconductor calibration wafer of FIG. 4.
Figure 7:
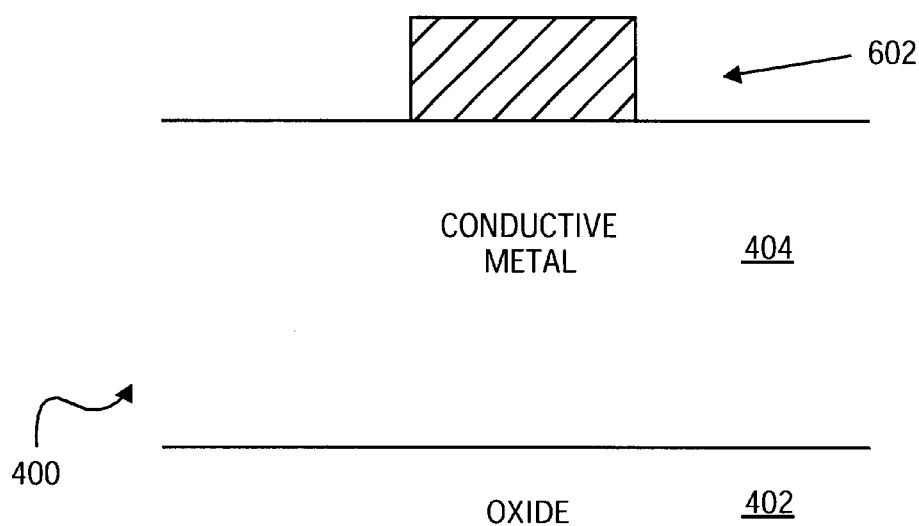
Figure 8:
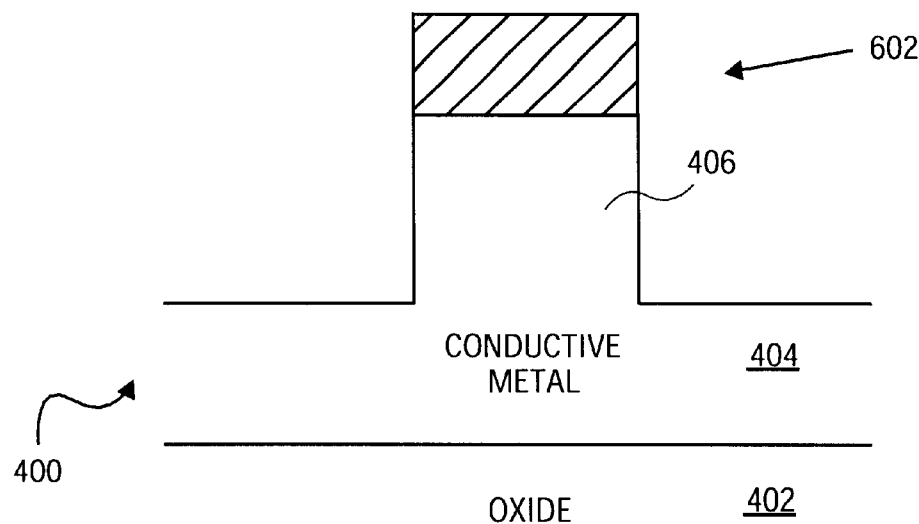

FIGS. 6–8 show how the wafer 400 of FIG. 4 can be fabricated according to one embodiment of the invention. In FIG. 6, a conductive metal layer 404 has been deposited on the oxide layer 402. A photoresist layer 602 has been applied to the conductive metal layer 404, and selectively exposed to a light source, such as an ultraviolet (UV) light source, and such as through a mask corresponding to the desired CD. In FIG. 7, the photoresist layer 602 is developed, such that only one part of the photoresist layer 602 remains, that which corresponds to the desired CD. Finally, in FIG. 8, the conductive metal layer 404 is partially etched to form the CD bar 406. Partial etching means that at least some of the metal layer 404 remains to completely cover the oxide layer 402. For instance, the oxide layer 402 may be covered by at least half of the metal layer 404 that was previously deposited over the oxide layer 402. Once the photoresist layer 602 is removed, the wafer 400 of FIG. 4 results.

Figure 9:
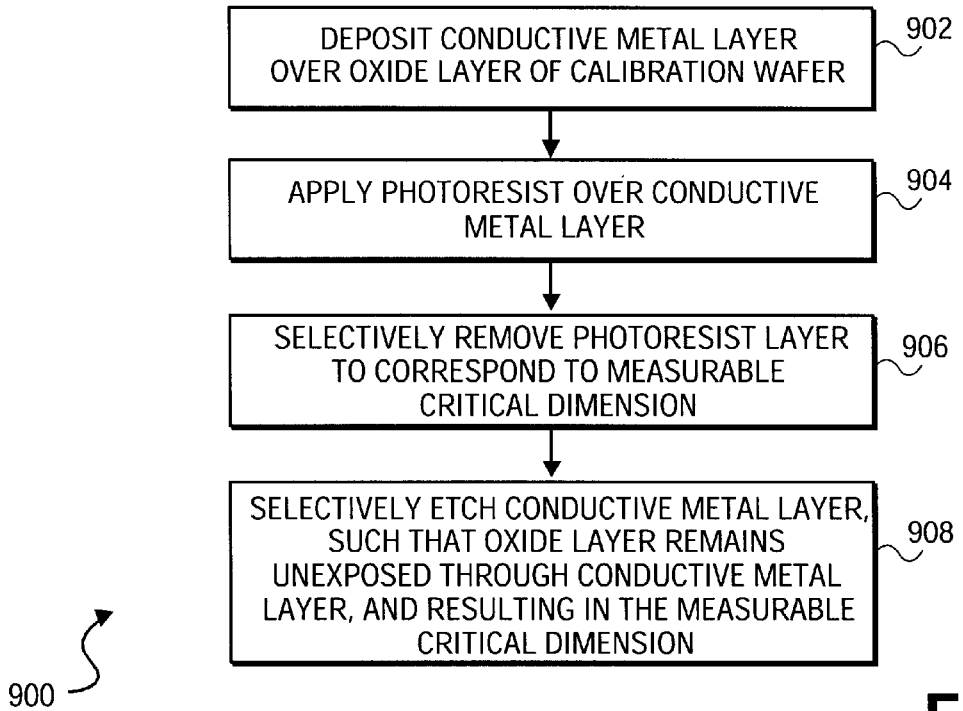
FIG. 9 is a flowchart of a method according to an embodiment of the invention that summarizes the fabrication of the semiconductor calibration wafer of FIG. 4 as shown in FIGS. 6, 7 and 8.

FIG. 9 shows a method 900 for fabricating a semiconductor calibration wafer, such as the wafer 400 of FIG. 4, according to an embodiment of the invention, and summarizes the fabrication described with reference to FIGS. 6–8. First, a conductive metal layer is deposited over an oxide layer, or other substrate layer, of a calibration wafer (902). A photoresist layer is applied, such as coated, over the conductive metal layer (904). The photoresist layer is selectively removed, such as through selective exposure and development, to correspond to a measurable CD (906). Finally, the conductive metal layer is selectively and partially etched (908), where the selective etching may be accomplished via the photoresist layer that remains after selective removal in 906. The etching results in the oxide layer remaining unexposed through the conductive metal layer, and a measurable CD, such as a CD bar, a CD line, and so on, in the metal layer.

More specifically, in one particular embodiment of the invention, selective and partial conductive metal layer etching is performed using a metal etch decoupled plasma source (DPS) semiconductor fabrication equipment available from Applied Materials Taiwan (AMT), of Taiwan. In particular, the etching is performed by modifying a standard inter-metal etching process. A break-through (BT) processing part of this process remains. However, the metal etching (ME) processing part of this process is changed from an E/P mode to a time mode. Furthermore, the ME time is set to half the normal E/P mode time, and the over-etching (OE) process part is skipped. The semiconductor pattern layout is thus a metal semi-pattern layout.

Figure 10:
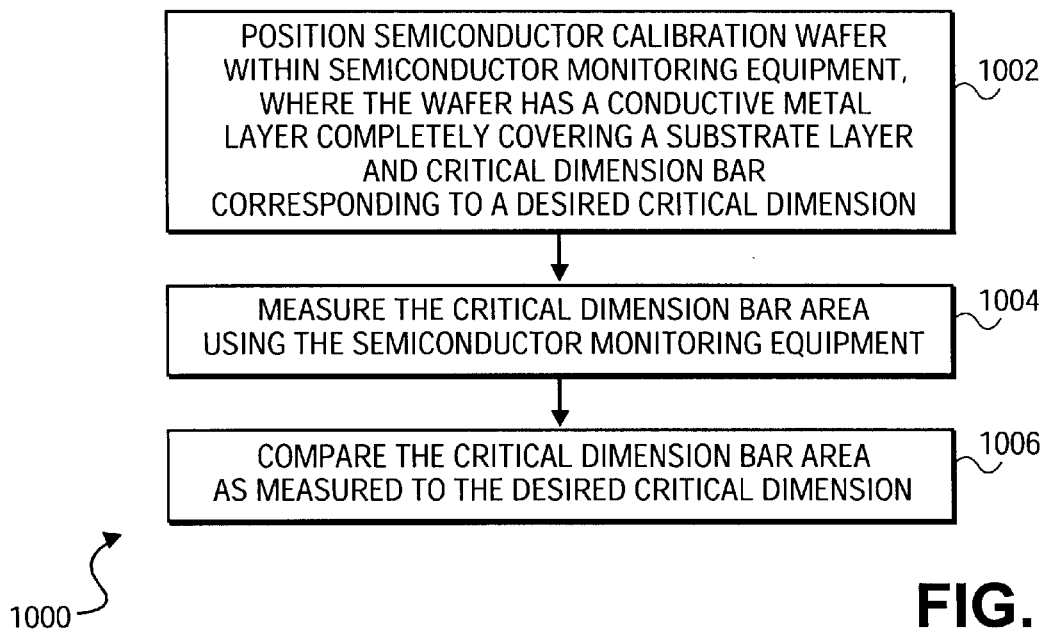
FIG. 10 is a flowchart of a method for CD monitoring according to an embodiment of the invention that can be used with semiconductor monitoring equipment like an SEM, and that uses a semiconductor calibration wafer like that of FIG. 4.

FIG. 10 shows a method 1000 for monitoring a desired CD of a semiconductor calibration wafer, such as the wafer 400 of FIG. 4, and which can be used with semiconductor monitoring equipment like an SEM. First, the wafer is positioned within the monitoring equipment The wafer has a conductive metal layer that completely covers a substrate layer. The conductive metal layer also has a CD bar, or line or area, that corresponds to the desired CD to be measured. The CD bar is measured using the equipment (1004), and compared to the desired CD to determine if it matches. Because the wafer is not susceptible to the charge effect, CD measurement is not skewed, even after a number of times of being measured, such as on a daily basis.

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. For example, whereas the invention has been substantially described in relation to a scanning electron microscope (SEM), it is applicable to other semiconductor monitoring equipment as well. Furthermore, whereas the invention has been described in relation to a semiconductor calibration wafer that is CD wafer, it is applicable to other types of calibration wafers. Therefore, it is manifestly intended that this invention be limited only by the claims and equivalents thereof.

What is claimed is:

1. A semiconductor calibration wafer comprising:
   a substrate layer;
   a conductive metal layer completely covering the substrate layer; and
   a critical dimension bar within the conductive metal layer corresponding to a desired critical dimension.

2. The wafer of claim 1, wherein the wafer is a scanning electron microscope (SEM) calibration wafer, such that electrons ejected by an SEM are carried away through the conductive metal layer.

3. The wafer of claim 1, wherein the wafer is a critical dimension calibration wafer.

4. The wafer of claim 1, wherein the substrate layer is an oxide layer.

5. The wafer of claim 1, wherein the conductive metal layer is a copper layer.

6. The wafer of claim 1, wherein the conductive metal layer is an aluminum layer.

7. A method for fabricating a semiconductor calibration wafer comprising:
   depositing a conductive metal layer on an oxide layer of the semiconductor calibration wafer; and
   selectively etching the conductive metal layer, such that the oxide layer is unexposed through the conductive metal layer, and resulting in a measurable critical dimension in the conductive metal layer.

8. The method of claim 7, further comprising, after depositing the conductive metal layer,
   applying a photoresist layer over the conductive metal layer; and
   selectively removing the photoresist layer to correspond to the measurable critical dimension.

9. The method of claim 8, wherein selectively removing the photoresist layer comprises
   selectively exposing the photoresist layer to correspond to the measurable critical dimension; and
   developing the photoresist layer to remove the photoresist layer as has been selectively exposed.

10. The method of claim 7, wherein selectively etching the conductive metal layer comprises etching the conductive metal layer such that the oxide layer remains covered with at least substantially half the conductive metal layer as deposited.

11. The method of claim 7, wherein the conductive metal layer comprises a copper layer.

12. The method of claim 7, wherein the conductive metal layer comprises an aluminum layer.

13. A method for monitoring a desired critical dimension comprising:
   positioning a semiconductor calibration wafer within semiconductor monitoring equipment, the wafer having a conductive metal layer completely covering a substrate layer and having a critical dimension bar area corresponding to the desired critical dimension;
   measuring the critical dimension bar area with the semiconductor monitoring equipment; and
   comparing the critical dimension bar area as measured to the desired critical dimension.

14. The method of claim 13, wherein the semiconductor monitoring equipment is a scanning electron microscope (SEM).

15. The method of claim 13, wherein the wafer is a scanning electron microscope (SEM) calibration wafer, such that electrons ejected by an SEM are carried away through the conductive metal layer.

16. The method of claim 13, wherein the wafer is a critical dimension calibration wafer.

17. The method of claim 13, wherein the wafer is a critical dimension scanning electron microscope (CD-SEM) calibration wafer.

18. The method of claim 13, wherein the substrate layer is an oxide layer.

19. The method of claim 13, wherein the conductive metal layer is a copper layer.

20. The method of claim 13, wherein the conductive metal layer is an aluminum layer.

* * * * *